United States Patent
Maimon et al.

(10) Patent No.: US 6,733,956 B2
(45) Date of Patent: May 11, 2004

(54) METHOD FOR MAKING PROGRAMMABLE RESISTANCE MEMORY ELEMENT

(75) Inventors: Jon Maimon, Manassas, VA (US); Andrew Pomerene, Leesburg, VA (US)

(73) Assignee: Ovonyx, Inc., Boise, ID (US)

( * ) Notice: Subject to any disclaimer, the term of this patent is extended or adjusted under 35 U.S.C. 154(b) by 149 days.

(21) Appl. No.: 10/072,324

(22) Filed: Feb. 8, 2002

(65) Prior Publication Data

US 2002/0197566 A1 Dec. 26, 2002

Related U.S. Application Data

(63) Continuation-in-part of application No. 09/891,551, filed on Jun. 26, 2001, now Pat. No. 6,589,714.

(51) Int. Cl.$^7$ .................................................. G03F 7/00
(52) U.S. Cl. ........................ 430/314; 430/319; 430/323; 430/324
(58) Field of Search ................................. 430/319, 314, 430/320, 323, 324

(56) References Cited

U.S. PATENT DOCUMENTS

| 4,803,181 A | * | 2/1989 | Buchmann et al. | 438/696 |
| 6,136,661 A | * | 10/2000 | Yen et al. | 438/396 |
| 2002/0036931 A1 | * | 3/2002 | Lowrey et al. | 365/200 |
| 2002/0045323 A1 | * | 4/2002 | Lowrey et al. | 438/382 |

\* cited by examiner

*Primary Examiner*—John A. McPherson
(74) *Attorney, Agent, or Firm*—Philip H. Schlazer; Marvin S. Siskind (57) ABSTRACT

A programmable resistance memory element using a conductive sidewall layer as the bottom electrode. The programmable resistance memory material deposited over the top edge of the bottom electrode in a slot-like opening formed in a dielectric material. A method of making the opening using a silylated photoresist.

14 Claims, 12 Drawing Sheets

FIG - 18

METHOD FOR MAKING PROGRAMMABLE RESISTANCE MEMORY ELEMENT

RELATED APPLICATION INFORMATION

This application is a continuation-in-part of U.S. patent application Ser. No. 09/891,551 filed on Jun. 26, 2001 now U.S. Pat. No. 6,589,714.

FIELD OF THE INVENTION

The present invention relates generally to programmable resistance memory elements. More specifically, the present invention relates to a new structural relationship between the electrodes and the memory material which are integral parts of the memory element.

BACKGROUND OF THE INVENTION

Programmable resistance memory elements formed from materials that can be programmed to exhibit at least a high or low stable ohmic state are known in the art. Such programmable resistance elements may be programmed to a high resistance state to store, for example, a logic ZERO data bit. As well, they may be programmed to a low resistance state to store, for example, a logic ONE data bit.

One type of material that can be used as the memory material for programmable resistance elements is phase change material. Phase change materials may be programmed between a first structural state where the material is generally more amorphous (less ordered) and a second structural state where the material is generally more crystalline (more ordered). The term "amorphous", as used herein, refers to a condition which is relatively structurally less ordered or more disordered than a single crystal and has a detectable characteristic, such as high electrical resistivity. The term "crystalline", as used herein, refers to a condition which is relatively structurally more ordered than amorphous and has lower electrical resistivity than the amorphous state.

The concept of utilizing electrically programmable phase change materials for electronic memory applications is disclosed, for example, in U.S. Pat. Nos. 3,271,591 and 3,530,441, the contents of which are incorporated herein by reference. The early phase change materials described in the '591 and '441 patents were based on changes in local structural order. The changes in structural order were typically accompanied by atomic migration of certain species within the material. Such atomic migration between the amorphous and crystalline states made programming energies relatively high.

The electrical energy required to produce a detectable change in resistance in these materials was typically in the range of about a microjoule. This amount of energy must be delivered to each of the memory elements in the solid state matrix of rows and columns of memory cells. Such high energy requirements translate into high current carrying requirements for the address lines and for the cell isolation/address device associated with each discrete memory element.

The high energy requirements for programming the memory cells described in the '591 and '441 patents limited the use of these cells as a direct and universal replacement for present computer memory applications, such as tape, floppy disks, magnetic or optical hard disk drives, solid state disk flash, DRAM, SRAM, and socket flash memory. In particular, low programming energy is important when the EEPROMs are used for large-scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the power consumption of the mechanical systems. In the case of lap-top computers, this is of particular interest because the mechanical hard disk drive is one of the largest power consumers therein. Therefore, it would be advantageous to reduce this power load, thereby substantially increasing the operating time of the computer per charge of the power cells. However, if the EEPROM replacement for hard drives has high programming energy requirements (and high power requirements), the power savings may be inconsequential or at best unsubstantial. Therefore, any EEPROM which is to be considered a universal memory requires low programming energy.

The programming energy requirements of a programmable resistance memory element may be reduced in different ways. For example, the programming energies may be reduced by the appropriate selection of the composition of the memory material. An example of a phase change material having reduced energy requirements is described in U.S. Pat. No. 5,166,758, the disclosure of which is incorporated by reference herein. Other examples of memory materials are provided in U.S. Pat. Nos. 5,296,716, 5,414,271, 5,359,205, and 5,534,712 disclosures of which are all incorporated by reference herein.

The programming energy requirement may also be reduced through the appropriate modification of the electrodes used to supply electrical energy to the memory material. For example, reduction in programming energy may be achieved by modifying the composition and/or shape and/or configuration (positioning relative to the memory material) of the electrodes. In particular, the programming energy requirements may be reduced by reducing the area of contact between the programmable resistance memory material and one or more of the electrodes. Examples of such "electrode modification" are provided in U.S. Pat. Nos. 5,341,328, 5,406,509, 5,534,711, 5,536,947, 5,687,112, 5,933,365, the disclosures of which are hereby incorporated by reference herein. Further examples are also provided in U.S. patent application Ser. Nos. 09/276,273, 09/620,318, 09/677,957, now U.S. Pat. No. 6,617,192, and 09/891,551, now U.S. Pat. No. 6,589,714, the disclosures of which are hereby incorporated herein by reference. The present invention is directed to novel structures of a programmable resistance memory element which may reduce the programming energy requirements. The present invention is also direct to methods for making these structures.

SUMMARY OF THE INVENTION

One aspect of the present invention is a method for making an opening in a layer of a first material of a semiconductor device, comprising the steps of: providing the layer of the first material; forming a layer of a second material over the layer of the first material, the second material being photoresist; removing a portion of the layer of the second material to form a photoresist mask over the layer of the first material; silylating the photoresist mask to form a top silylated portion and a sidewall silylated portion; forming a layer of a third material over the top silylated portion, over the sidewall silylated portion and over an exposed portion of the layer of the first material; removing a portion of the layer of the third material; removing the top and sidewall silylated portions; and removing a portion of the layer of the first material to form the opening.

Another aspect of the present invention is a method for making a programmable resistance memory element, comprising the steps of: providing a layer of a conductive material; forming a layer of a first material over the layer of the conductive material; forming a layer of a second material over the layer of the first material, the second material being photoresist; removing a portion of the layer of the second material to form a photoresist mask over the layer of the first material; silylating the photoresist mask to form a top silylated portion and a sidewall silylated portion; forming a layer of a third material over the top silylated portion, over the sidewall silylated portion and over an exposed portion of the layer of the first material; removing a portion of the layer of the third material; removing the top and sidewall silylated portions; removing a portion of the layer of the first material to form an opening in the layer of the first material; and depositing a programmable resistance material into the opening, the programmable resistance material in communication with the layer of the conductive material.

BRIEF DESCRIPTION OF THE DRAWINGS

FIGS. 4A through 16 shows a process for making an embodiment of the memory cell of the present invention;

DETAILED DESCRIPTION OF THE INVENTION

In the following paragraphs and in association with the accompanying figures, examples of memory devices formed according to embodiments of the invention are presented. Specific embodiments of memory elements and methods of making such memory elements are described below as they might be implemented for use in semiconductor memory circuits. In the interest of clarity, not all features of an actual implementation are described in this specification.

The present invention is directed to programmable resistance memory elements. The memory element comprises a programmable resistance material as the memory material. The programmable resistance material is programmable between at least a first resistance state and a second resistance state in response to an electrical signal. The memory element further comprises a means of delivering the electrical signal to the volume of memory material. Preferably, the means of delivering the electrical signal comprises a first and a second electrical contact, also referred to as first and second electrodes, which are in electrical communication with the volume of memory material. The electrical contacts or electrodes do not have to be in physical contact with the memory material. (It is noted, that as used herein, the terminology "electrical contacts" and "electrodes" are synonymous and may be used interchangeably).

Figure 1:
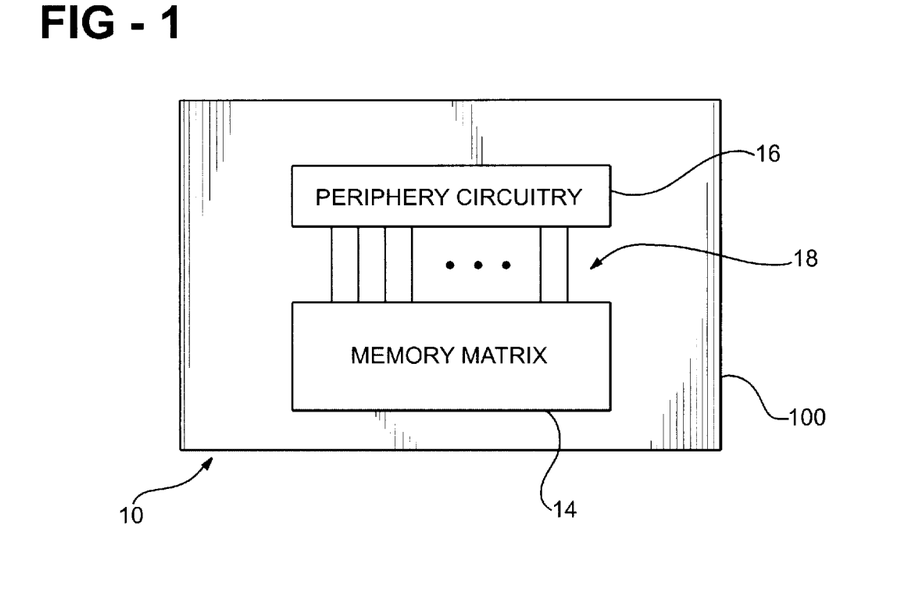
FIG. 1 shows a high-level diagram of a memory device of the present invention including a memory array and periphery circuitry formed on a substrate.

Turning now to the drawings, and referring initially to FIG. 1, a memory device is illustrated and generally designated by a reference numeral 10. The memory device 10 is an integrated circuit memory formed on a semiconductor substrate 100. The memory device 10 includes a memory matrix or array 14 that includes a plurality of memory cells for storing data. The memory matrix 14 is coupled to periphery circuitry 16 by the plurality of control lines 18. The periphery circuitry 16 may include circuitry for addressing the memory cells contained within the memory array 14, along with circuitry for storing data in and retrieving data from the memory cells. The periphery circuitry 16 may also include other circuitry used for controlling or otherwise insuring the proper functioning of the memory device 10.

Figure 2A:
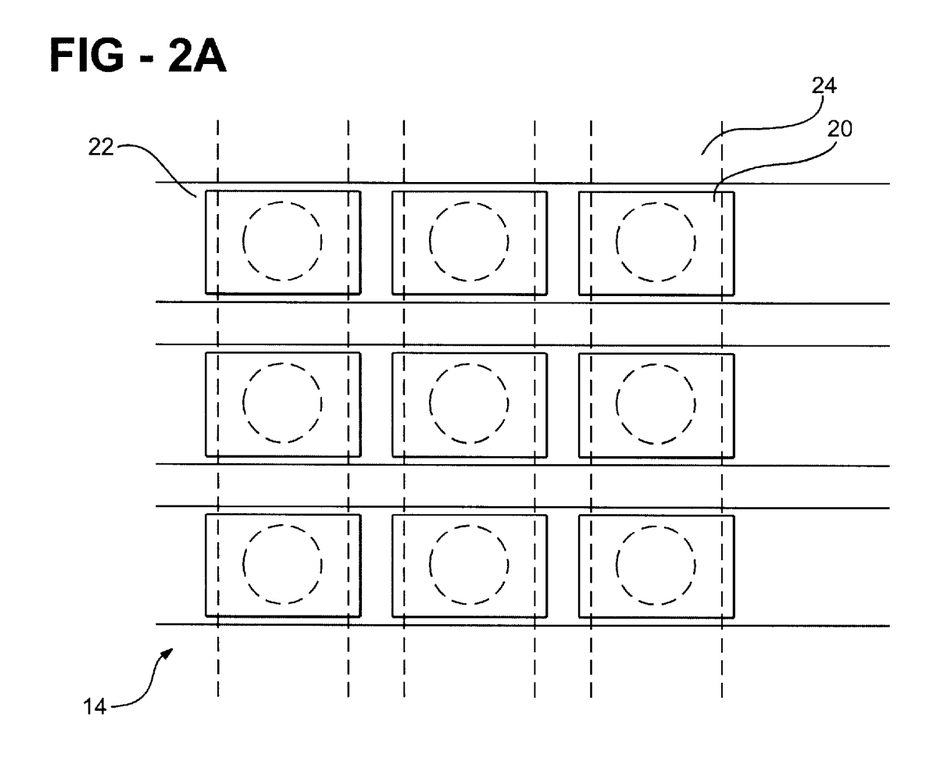
FIG. 2A shows a high-level diagram of a memory array of the present invention.

A top view of the memory array 14 is shown in FIG. 2A. As can be seen, the memory array includes a plurality of memory cells 20 that are arranged in generally perpendicular rows and columns. As can be seen, the memory array 14 includes a plurality of memory cells 20 that are arranged in generally perpendicular rows and columns. The memory cells 20 in each row are coupled together by a respective wordline 22, and the memory cells 20 in each column are coupled together by a respective bitline 24.

Figure 2B:
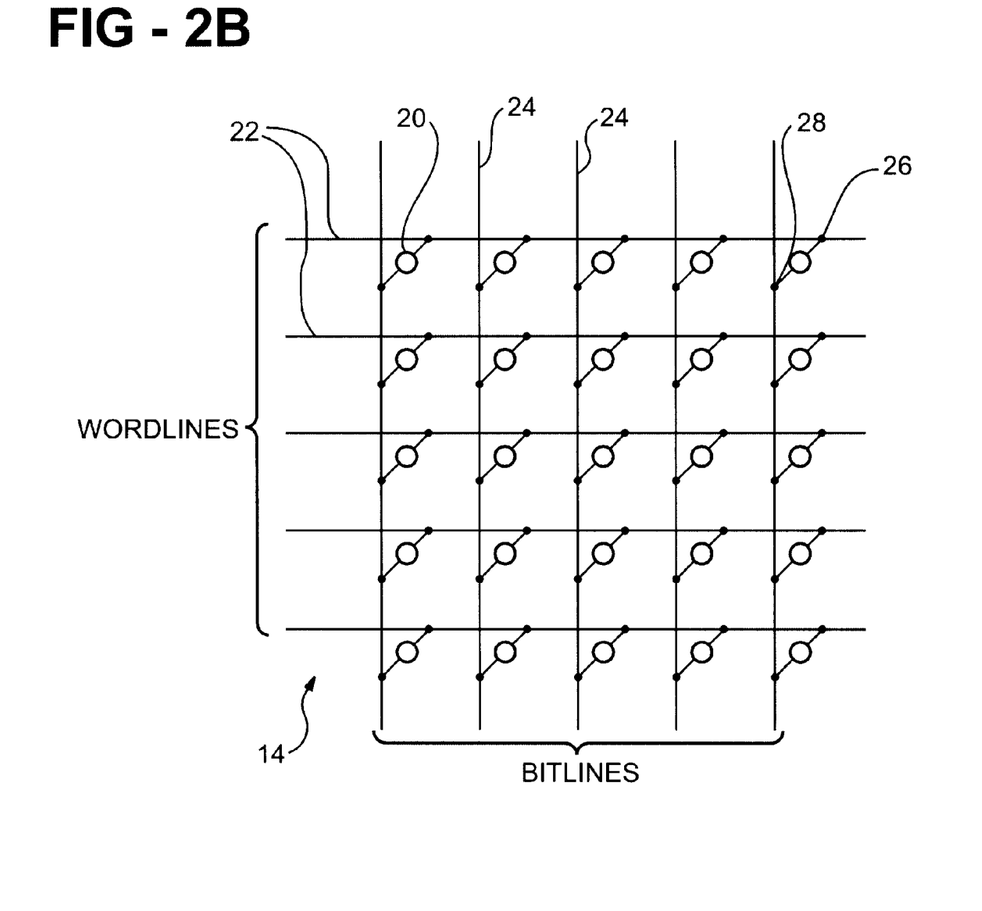
FIG. 2B is a schematic diagram of a memory array of the present invention.

A schematic diagram of the memory array 14 is shown in FIG. 2B. As can be seen, each memory cell 20 includes a wordline node 26 that is coupled to a respective wordline 22, and each memory cell 20 includes a bitline node 28 that is coupled to a respective bitline 24. The conductive wordlines 22 and bitlines 24 are collectively referred to as address lines. These address lines are electrically coupled to the periphery circuitry (shown in FIG. 1) so that each of the memory cells 20 can be accessed for the storage and retrieval of information.

Figure 3:
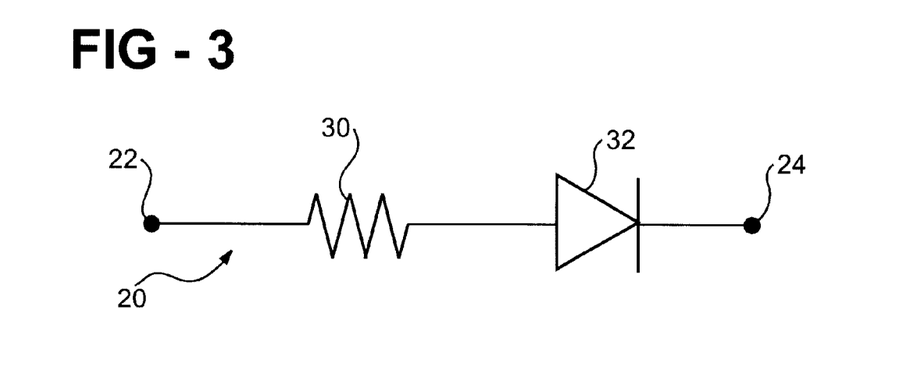
FIG. 3 is a schematic diagram of a memory cell incorporating a programmable resistance material.

FIG. 3 illustrates an exemplary memory cell 20 that may be used in the memory array 14. The memory cell 20 includes a memory element 30 which is coupled to an access device 32. The access device electrically isolates each memory element from all other memory elements in the array. In this embodiment, the memory element 30 is illustrated as a programmable resistive element, and the access device 32 is illustrated as a diode. The programmable resistive element may be made of a chalcogenide material, as will be more fully explained below. As illustrated in FIG. 3, the memory element 30 is coupled to a wordline 22, and the access device 32 is coupled to a bitline 24. However, it should be understood that connections of the memory element 20 may be reversed without adversely affecting the operation of the memory array 14.

Figure 16:
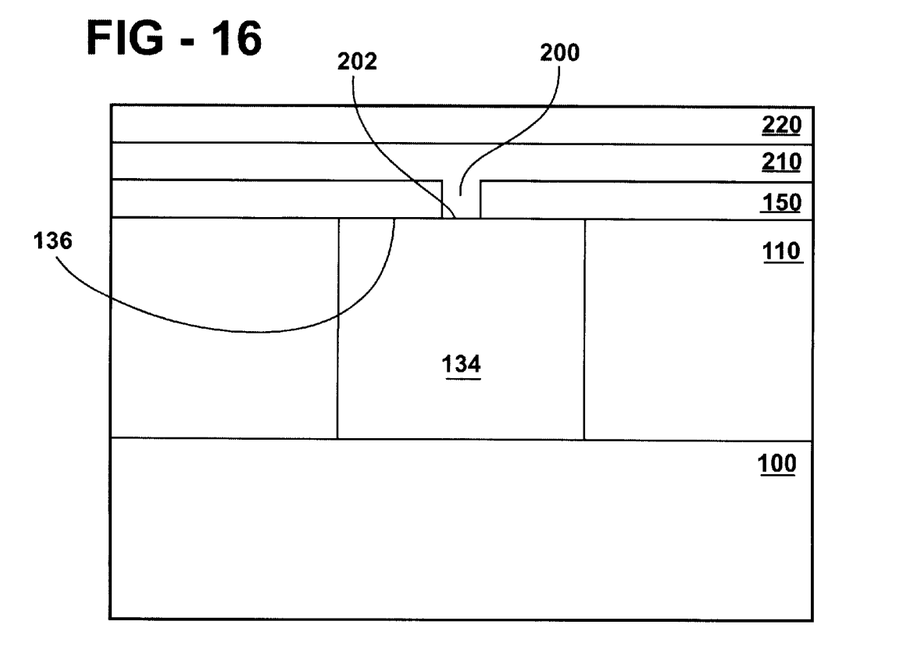
Figure 17:
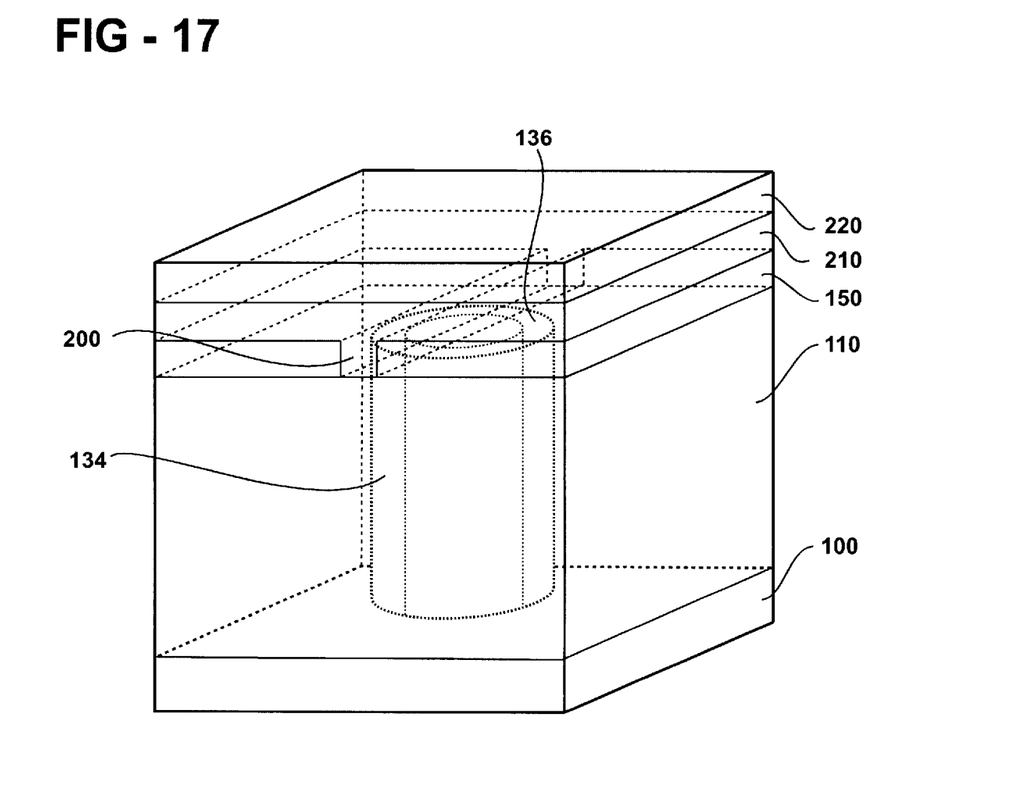
FIG. 17 shows an embodiment of the memory cell of the present invention.

A structure of an exemplary memory cell 20 is illustrated in FIG. 17, while a method for fabricating the memory cell 20 is described with reference to FIGS. 4–16. It should be understood that while the fabrication of only a single memory cell 20 is discussed below, a plurality of similar memory cells may be fabricated simultaneously. Although not illustrated, each memory cell is electrically isolated from other memory cells in the array in any suitable manner, such as by the addition of imbedded field oxide regions between each memory cell.

Figure 4A:
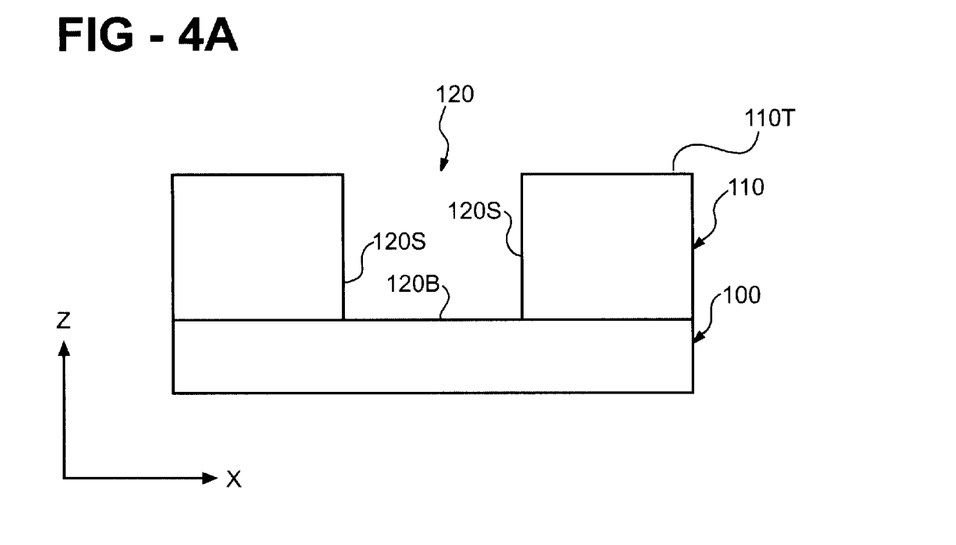

Referring first to FIG. 4A, a semiconductor substrate 100 is provided. The substrate 100 may include the access devices as well as the bitlines and/or wordlines. A layer of dielectric material 110 is formed on top of the substrate 100. The layer 110 may be comprised of any suitable dielectric material, such as silicon nitride or silicon dioxide. The dielectric layer 110 may be formed in any suitable manner, such as by chemical vapor deposition (CVD). The dielectric layer 110 has a top surface 110T.

Referring to FIG. 4A, an opening 120 (also referred as a "window") is formed through the dielectric layer 110 to expose a portion of the underlying substrate. Generally, the opening 120 may be any shape. For example, the opening 120 may be formed as a generally rectangular or circular hole. Alternately, the opening 120 may be formed as a trench. The opening 120 includes the sidewall surface 120S about the periphery of the opening and the bottom surface 120B. The opening 120 is preferably a substantially circular hole as shown in FIG. 4B.

Any suitable method of forming the opening 120 may be used. For example, using standard photolithographic techniques, a hard mask (not shown) may be deposited on top of the dielectric layer 110 and patterned in the size and shape of the resulting opening 120. Hence, the opening 120 may be sized at the photolithographic limit.

Figure 4B:
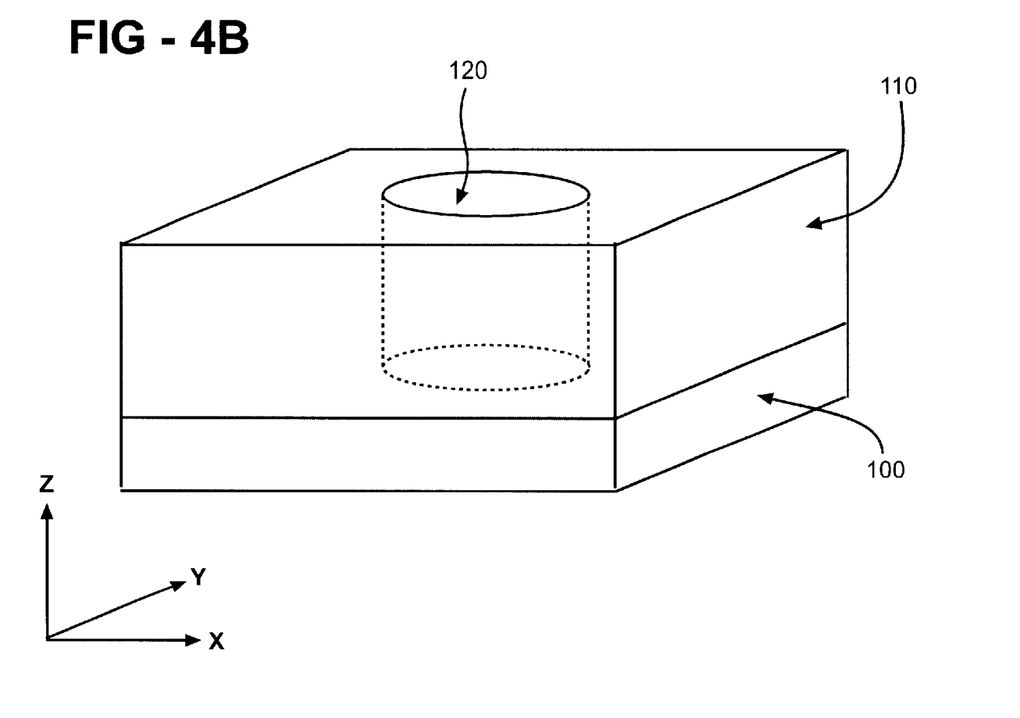
Figure 5:
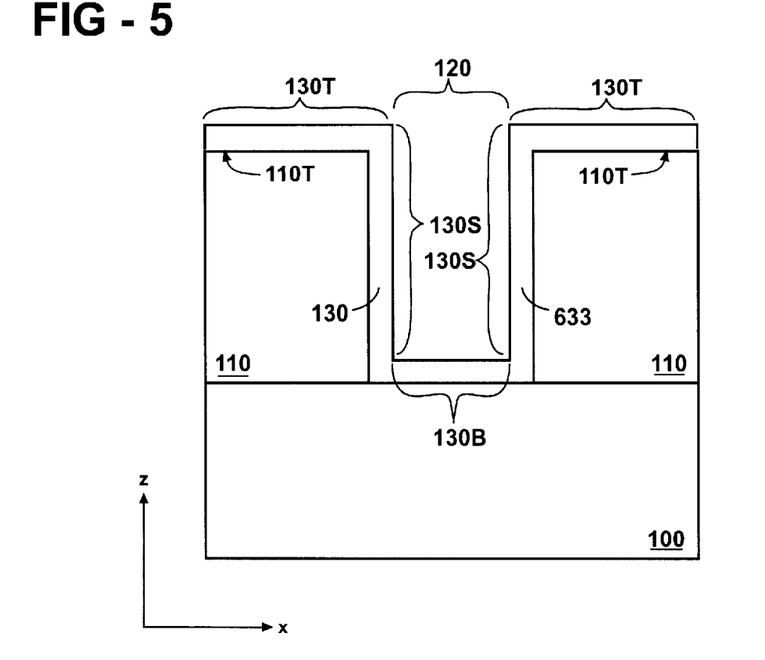

As shown in FIG. 5, a layer 130 of a conductive material is deposited on top of the structure shown in FIGS. 4A and 4B. The layer 130 of conductive material is deposited on top surfaces 110T of the dielectric region 110 as well as on the sidewall surface 120S and on the bottom surface 120B of opening 120. Preferably, the deposition of the layer 130 is a substantially conformal deposition. Hence, the layer 130 has a top portion 130T, a sidewall layer portion 130S, and a bottom layer portion 130B.

The conductive material used for layer 130 may be any conductive material. Examples of materials which may be used for layer 130 are include, but are not limited to, n-type doped polysilicon, p-type doped polysilicon, p-type doped silicon carbon alloys and/or compounds, n-type doped silicon carbon alloys and/or compounds, titanium-tungsten, tungsten, tungsten silicide, molybdenum, and titanium nitride. Other examples include titanium carbon-nitride, titanium aluminum-nitride, titanium silicon-nitride, and carbon.

Figure 6:
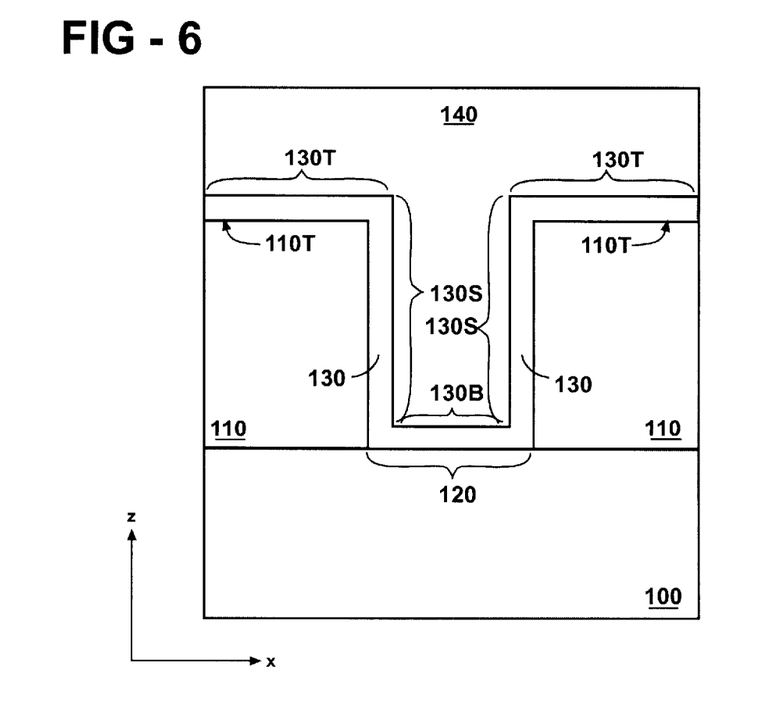
Figure 7A:
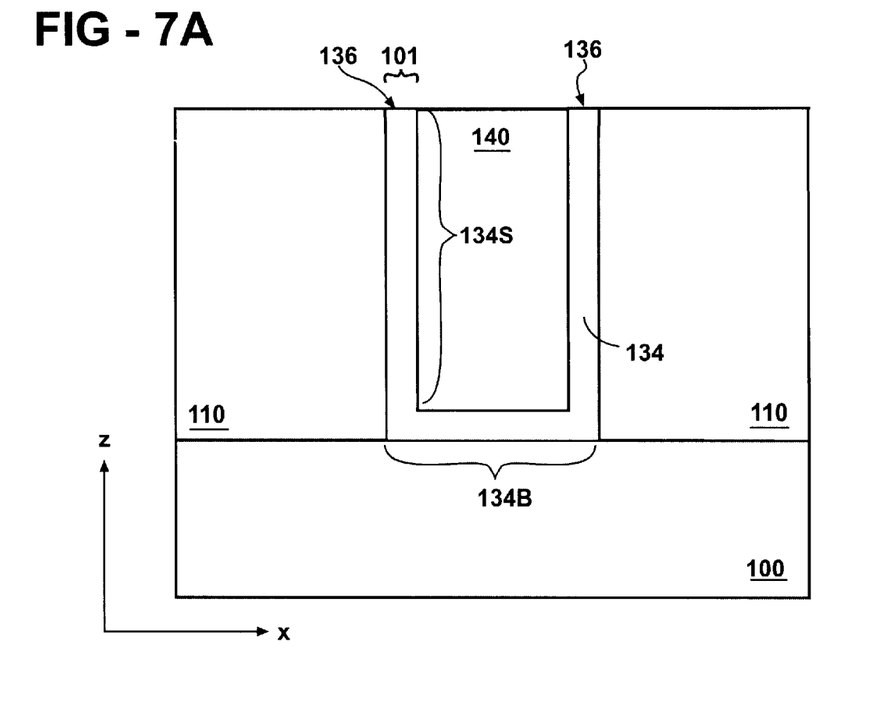

Referring to FIG. 6, a layer of dielectric material 140 (such as silicon dioxide) may then be deposited on top of the layer 130. Preferably, the dielectric layer 140 fills the remaining portion of the opening 120 and is deposited above the top surfaces 110T. The structure shown in FIG. 6 may then be chemically mechanically polished (CMP) or dry etched so as to planarize the top surface, thereby removing the top surface portion 130T of the layer 130 and forming the bottom electrode 134 as shown in FIG. 7A (cross-sectional view parallel to the x-z plane) and in FIG. 7B (three-dimensional view). The bottom electrode 134 is in the form of a cylindrical, cup-shaped conductive liner 134. The bottom electrode 134 has a top edge portion 136 which is in the shape of an annulus. The bottom electrode 134 has a sidewall layer portion 134S and a bottom layer portion 134B. The bottom electrode has a thickness "W1" which is defined by the thickness of the conformal deposition of conductive layer 130 shown in FIG. 5. Preferably, the thickness W1 is smaller than that which could be achieved by standard photolithography. That is, the thickness W1 is preferably less than the photolithographic limit. In one embodiment of the present invention, the thickness W1 is preferably less than about 500 Angstroms and, more preferably, less than about 300 Angstroms.

Figure 7B:
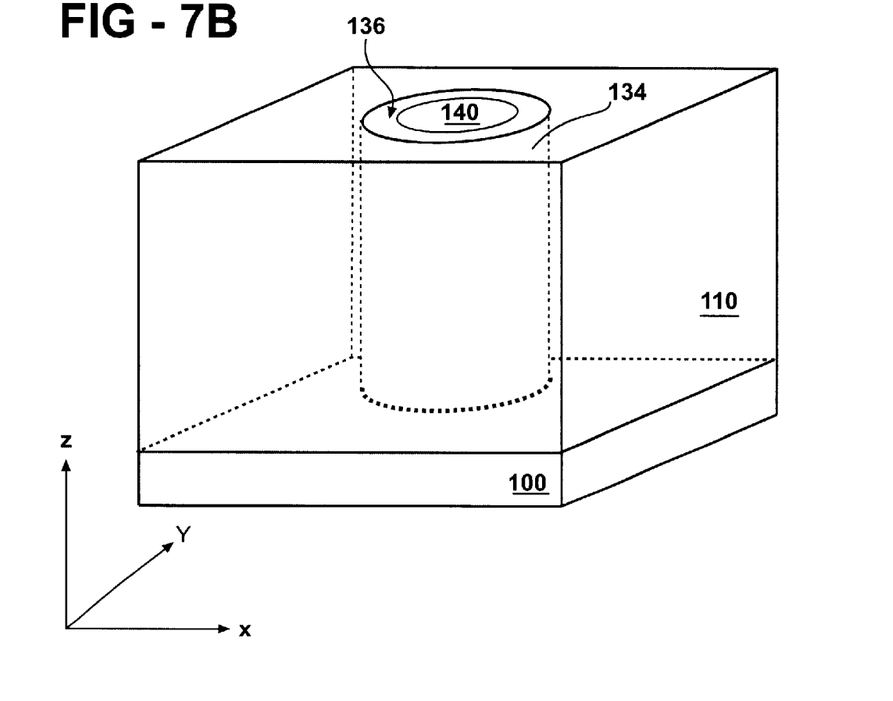

In the example shown in FIGS. 7A and 7B, the bottom electrode 134 is cylindrically shaped and the exposed edge 136 forms an annularly shaped contact surface. As discussed above, the opening 120 (shown in FIGS. 4A and 4B) may also be formed as a trench. In this case, the resulting bottom electrode would be a conductive sidewall liner that is U-shaped, having a bottom surface and two sidewall surfaces. The resulting exposed edge portion of the U-shaped conductive liner would be two linear contact surfaces. In an alternate embodiment of the invention, the bottom electrode may be formed as a conductive spacer rather than as a conductive liner.

Figure 7C:
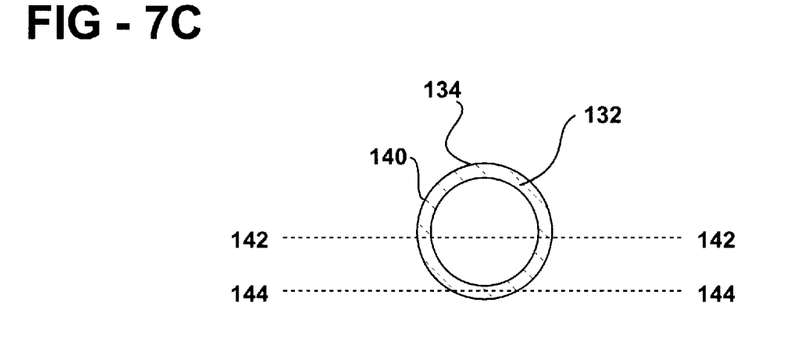
Figure 7D:
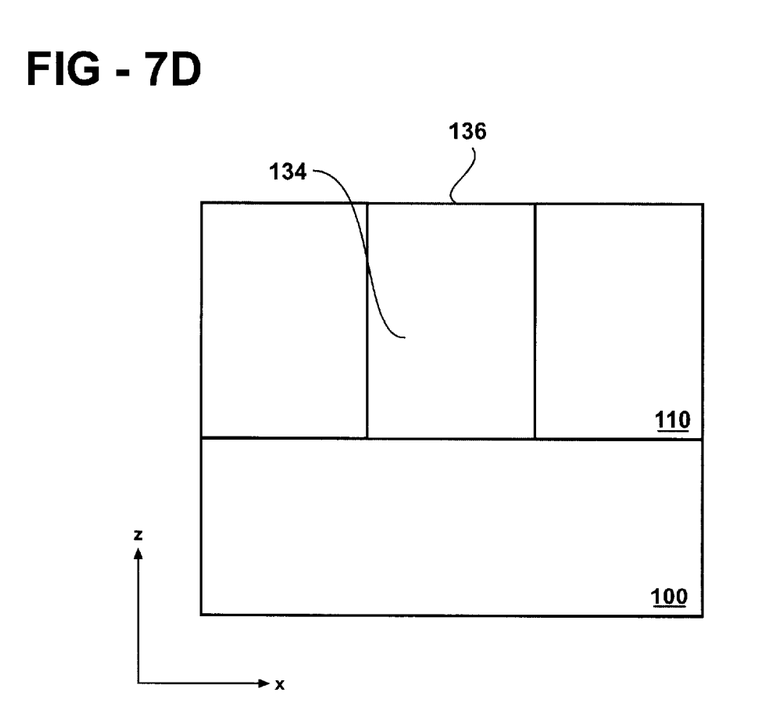

FIG. 7C shows a top view of the bottom electrode 134 showing the top edge 136 and dielectric 140. FIG. 7A is the cross-sectional view through taken from line 142–142 of FIG. 7C. FIG. 7D is the cross-sectional view taken from line 144—144 of FIG. 7C.

Figure 8:
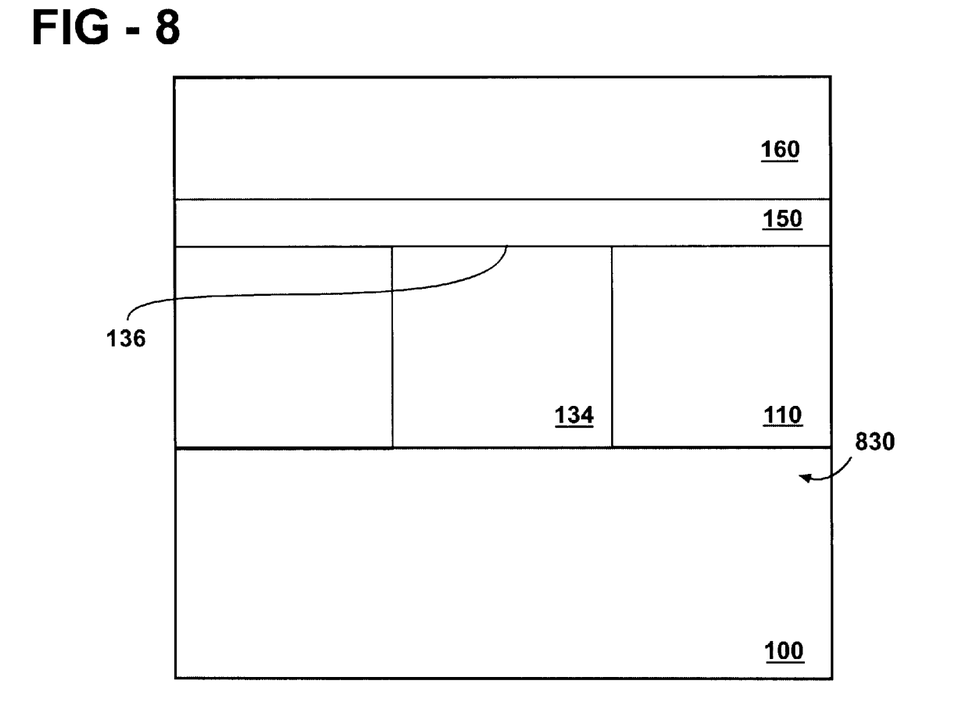

Referring to FIG. 8, a layer 150 is deposited over the top surface of the structure shown in FIG. 7D (again, this is the cross-sectional view taken from line 144—144 of FIG. 7C). Preferably, the layer 150 comprises a dielectric material. More preferably, layer 150 is a oxide layer (such as silicon dioxide from a TEOS source). The layer 150 may be deposited by any suitable manner such as by chemical vapor deposition or by physical vapor deposition. It is noted that in an alternate embodiment of the invention it may be possible to use a different dielectric material (such as a nitride).

Figure 9A:
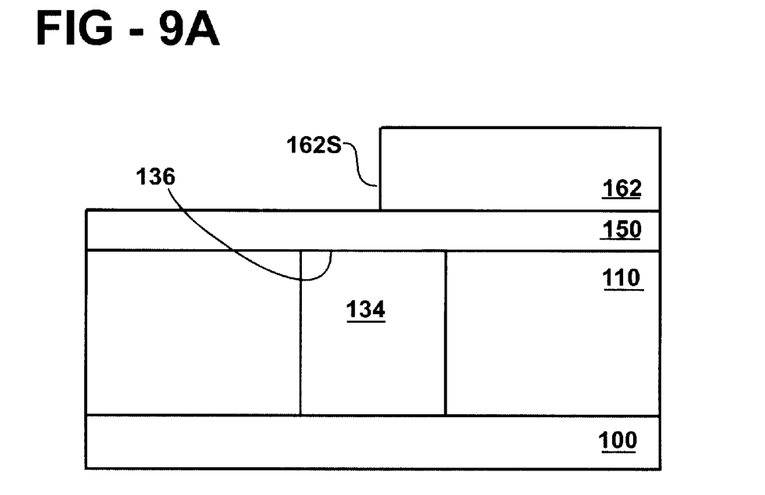
Figure 9B:
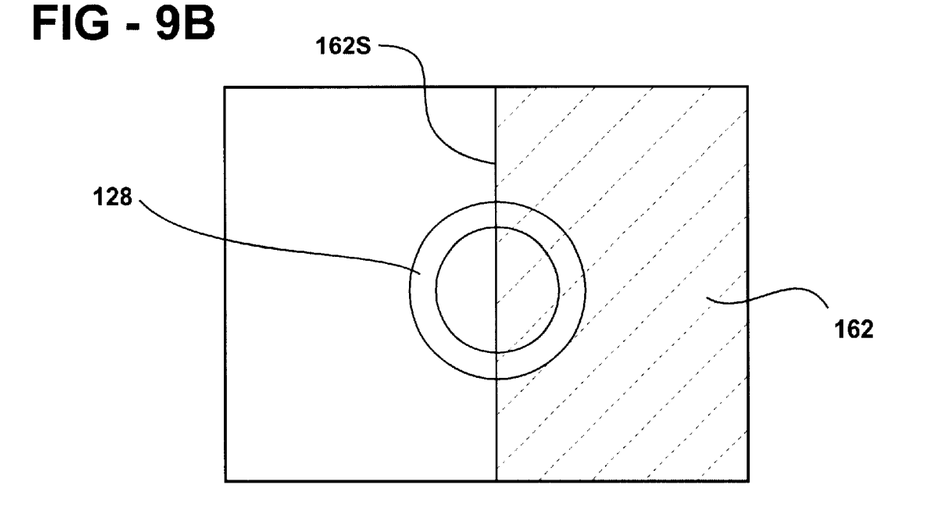

Referring to FIG. 8, a layer 160 of photoresist is then deposited over the oxide layer 150. Referring to FIG. 9A, a portion of the photoresist is then removed (that is, the photoresist layer is patterned) and the remaining portion of the photoresist layer forms the photoresist mask 162 having the sidewall surface 162S. FIG. 9B is a top view of the structure from FIG. 9A. The position of the sidewall surface 162S relative to the edge portion 136 of the conductive liner 134 is shown in FIG. 9B.

Figure 10:
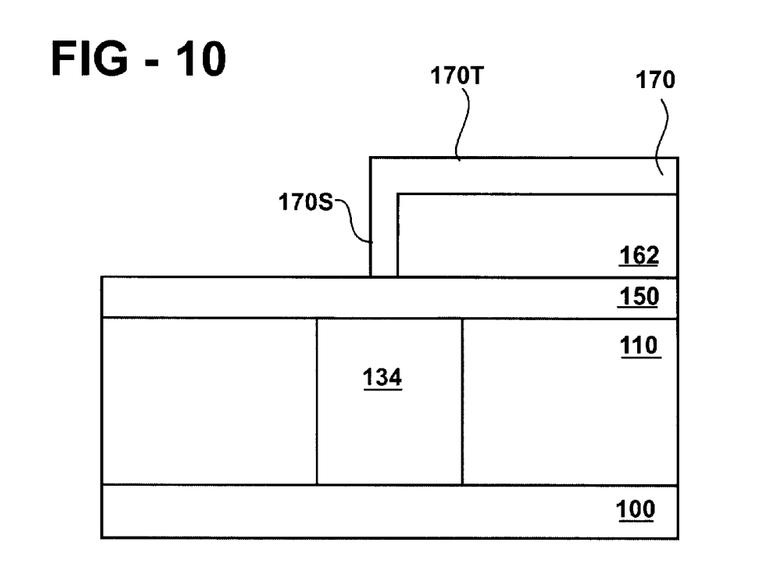

Referring to FIG. 10, the photoresist mask 162 is then silylated. Silylation is the diffusion of silicon into the photoresist material. During silylation, the photoresist is heated in an atmosphere is preferably heated in an atmosphere of between about 50° C. and 70° C. for a time period which is preferably between about 2 and about 10 minutes. Typical silylation agents include dimethylsilydimethylamine (DMSDMA), dimethylsilydiethylamine (DMSDEA), dimethylaminopentamethyldisilane (DMDS), and N,N-dimethylaminopentamethyldisilane. The hydrogen radicals in the photoresist mask 162 are displaced by silicon atoms in the silylating agent to form the silylated layer 170. Referring to FIG. 10 it is seen that a top silylated portion 170T is formed on the top surface of the photoresist mask 162 and a sidewall silylated portion 170S is formed on the sidewall surface of the photoresist mask 162.

Figure 11:
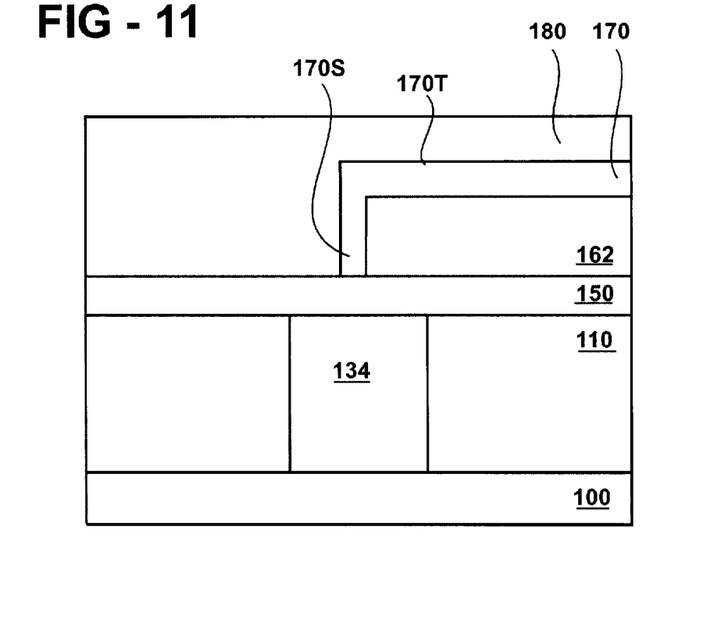

Referring to FIG. 11, another layer 180 of photoresist is then deposited over the structure of FIG. 10. That is, the photoresist layer 180 is deposited over the top silylated portion 170T and the sidewall silylated portion 170S of the silylated layer 170. The second layer of photoresist 180 is also deposited over an exposed portion of the oxide layer 150. It is noted that in another embodiment to the invention, the layer 180 may be formed from an alternate material (such as a spun on material).

Figure 12:
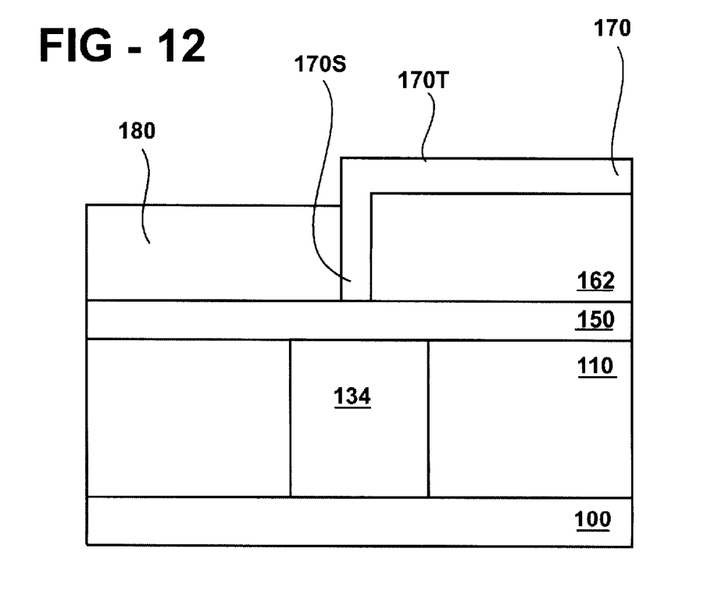

Referring to FIG. 12, the photoresist layer 180 is then etched. Endpoint detection may be used to detect the top surface of the silylated layer 170.

Figure 13:
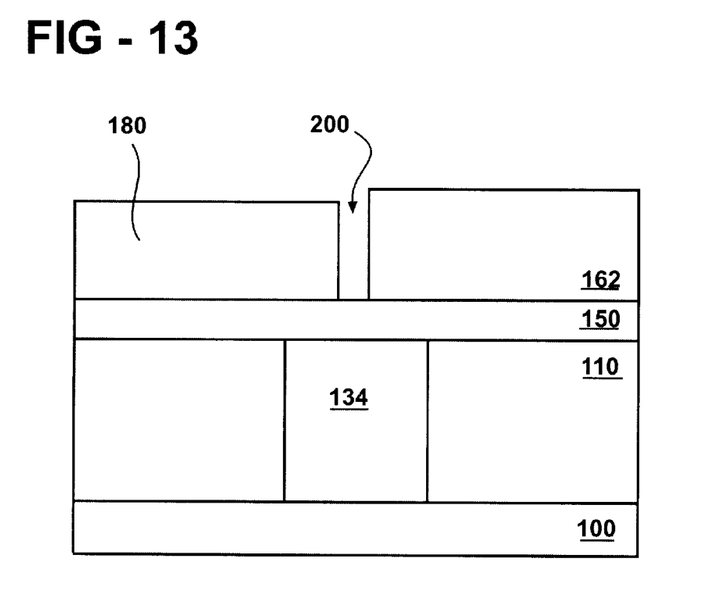
Figure 14:
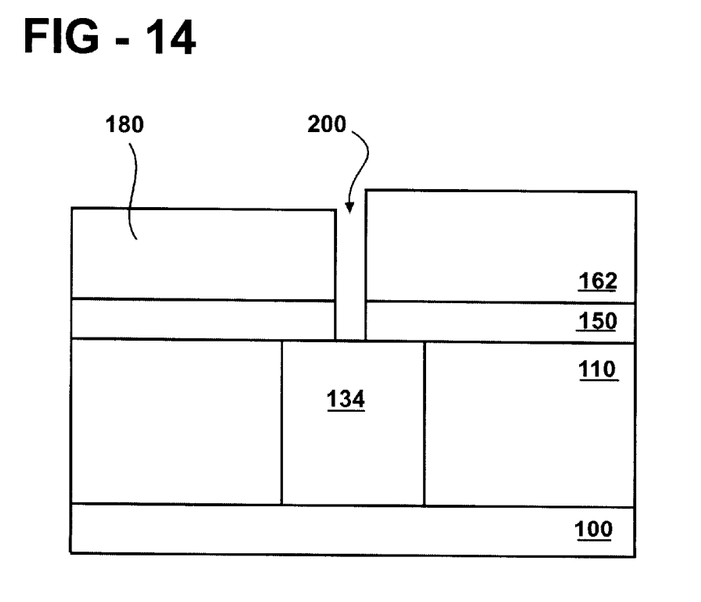

Referring to FIG. 13, the silylated layer 170 (including both the top silylated portion 170T and the sidewall silylated portion 170S) is then removed by an etch process to form the opening 200 between the two layers 162 and 180 of photoresist. Referring to FIG. 14, the opening 200 is then extended to the edge 136 of the bottom electrode 134 by etching the oxide layer 150. The remaining portions of the photoresist layers 162 and 180 are then removed using a photoresist stip to form the structure shown in FIG. 15.

Figure 15:
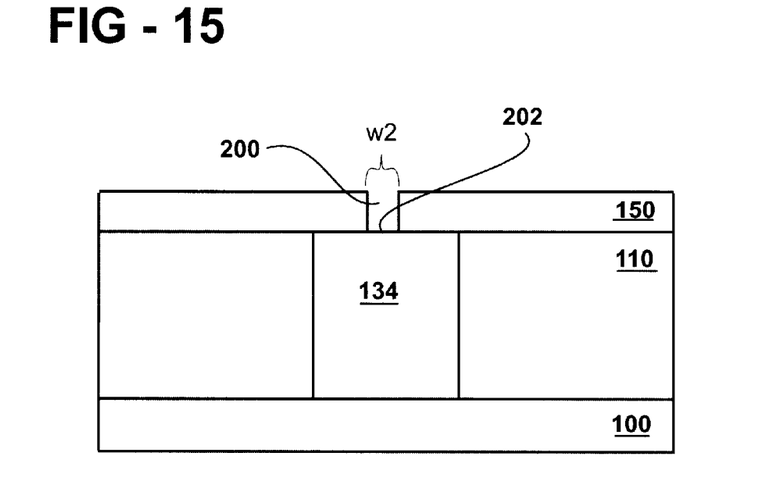

Referring to FIG. 15, it is noted that the opening 200 is in the form of a narrow trench or slot having a bottom surface 202. The opening 200 has a width "W2" (a lateral dimension of the opening) which is very small. In one embodiment of the invention, the width "W2" is less than the photolithographic limit. The width "W2" is preferably less than about 500 Angstroms and, is more preferably less than about 300 Angstroms.

Referring to FIG. 16, a layer 210 of programmable resistance material is deposited over the oxide layer 150 and into the opening 200. The programmable resistance material is thus adjacent to (and preferably makes contact with) the exposed portion of the top edge of the bottom electrode 134. Substantially all electrical communication between the bottom electrode 134 and the programmable resistance material is preferably through the exposed portion of the top edge 136 of the bottom electrode 134. A layer 220 of conductive material is then deposited over the layer 210 of programmable resistance material. The conductive layer 220 forms the top electrode of the memory device. A three-dimensional view of the memory device is shown in FIG. 17.

Referring to FIGS. 16 and 17, it is noted that the memory structure of the present invention provides for a very small total area of contact between the bottom electrode 134 and the programmable resistance memory material 210. Preferably, substantially all electrical communication between the bottom electrode 134 and the memory material 210 is through that portion of the upper edge 136 that is adjacent to (or actually makes contact with) the bottom surface 202 of the opening 200.

Figure 18:
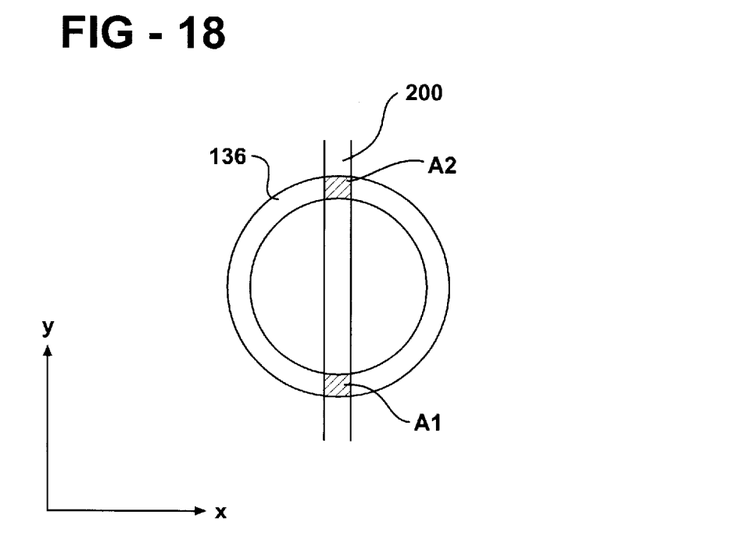
FIG. 18 is a top view of an embodiment of the memory cell of the present invention.

The two areas of contact "A1" and "A2" between the memory material and the bottom electrode may be seen in FIG. 18 which shows a top view of the slot 200 in relation to the edge 136 of the bottom electrode 134. As noted above, the thickness "W1" of the upper edge 136 may be less than or equal to about 300 Angstroms while the width "W2" of the opening 200 may be less than or equal to about 300 Angstroms. Hence, the surface area of each area of contact A1 and A2 may be less than or equal to about 90,000 square Angstroms.

It is noted that in the embodiment of the invention shown in FIGS. 16 and 17, the opening 200 is in the form of a narrow trench. In an alternate embodiment of the invention, it is possible that the opening 200 be in the form of an annulus. In yet another embodiment of the invention, the opening 200 may be in the form of a hole or pore. This will also result in a small area of contact between the bottom electrode and the programmable resistance material deposited into the hole.

In addition, in an alternate embodiment of the present invention is also possible to form a layer of programmable resistance memory material and position the layer of memory material so that only an edge of the memory material is adjacent to the edge 136 of the bottom electrode. Hence, substantially all electrical communication between the bottom electrode 134 and the memory material would be through the portion of the edge of the electrode and the portion of the edge of the memory material that are adjacent (or in actual contact). This "edge-to-edge" type of structure also provides for a small area of contact between the memory material and bottom electrode. Preferably, the edge of the programmable resistance material is positioned transverse to edge of the bottom electrode.

It is further noted that one or more additional layers may be disposed between the bottom electrode and the programmable resistance material. For example, a barrier layer may, optionally, be formed between the top edge of the bottom electrode and the programmable resistance material. Barrier layer materials may be chosen to increase the conductivity between the bottom electrode and the memory material, and/or improve the adhesion between the bottom electrode and the memory material, and/or to prevent the electromigration of the electrical contact material into the memory material. Examples of certain barrier layer materials include, but are not limited to, titanium silicide, cobalt silicide and tungsten silicide.

The memory elements of the present invention may be electrically coupled to isolation/selection devices and to addressing lines in order to form a memory array. The isolation/addressing devices permit each discrete memory cell to be read and written to without interfering with information stored in adjacent or remote memory cells of the array. Generally, the present invention is not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies.

Hence, associated with each memory element of a memory array structure is isolation/addressing device which serves as an isolation/addressing device for that memory element thereby enabling that cell to be read and written without interfering with information stored in other adjacent or remote memory elements of the array.

The programmable resistance material may be programmed to at least first resistance state and a second resistance state. The programmable resistance material is preferably programmed by electrical signals (such as currents). In one embodiment, the memory material is programmable to two resistance states so that each of the memory elements is capable of storing a single bit of information. In another embodiment, the memory material is programmable to at least three resistance states so that each of the memory elements is capable of storing more than one bit of information. In yet another embodiment, the memory material is programmable to at least four resistance states so that each of the memory elements is capable of storing at least two bits of information. Hence, the memory materials may have a range of resistance values providing for the gray scale storage of multiple bits of information.

The programmable resistance materials may be directly overwritable so that they can be programmed from any of their resistance states to any other of their resistance states without first having to be set to a starting state. Preferably, the same programming pulse or pulses may be used to program the memory material to a specific resistance state regardless of its previous resistance state. (For example, the same current pulse or pulses may be used to program the material to its high resistance state regardless of its previous state). An example of a method of programming the memory element is provided in U.S. Pat. No. 6,075,719, the disclosure of which is incorporated by reference herein.

The memory material may be a phase change material. The phase-change materials may be any phase change memory material known in the art. Preferably, the phase change materials are capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te, Se, and mixtures or alloys thereof. The memory material may further include at least one element selected from the group consisting of Ge, Sb, Bi, Pb, Sn, As, S, Si, P, O, and mixtures or alloys thereof. In one embodiment, the memory material comprises the elements Te, Ge and Sb. In another embodiment, the memory material consists essentially of Te, Ge and Sb. An example of a memory material which may be used is $Te_2Ge_2Sb_5$.

The memory material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

A first example of an elementally modified memory material is a phase-change memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. Preferably, the transition metal may include Cr, Fe, Ni, Nb, Pd, Pt and mixtures or alloys thereof.

A second example of an elementally modified memory material is a phase-change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. Preferably, the transition metal may include Cr, Fe, Ni, Pd, Pt, Nb, and mixtures or alloys thereof.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A method for making an opening in a layer of a first material of a semiconductor device, comprising the steps of:
    providing said layer of said first material;
    forming a layer of a second material over said layer of said first material, said second material being photoresist;
    removing a portion of said layer of said second material to form a photoresist mask over said layer of said first material;
    silylating said photoresist mask to form a top silylated portion and a sidewall silylated portion;
    forming a layer of a third material over said top silylated portion, over said sidewall silylated portion and over an exposed portion of said layer of said first material;
    removing a portion of said layer of said third material;
    removing said top and sidewall silylated portions; and
    removing a portion of said layer of said first material to form said opening.

2. The method of claim 1, wherein said third material is photoresist.

3. The method of claim 1, further comprising the step of:
    after removing said portion of said layer of said first material, removing said layer of said second material and said layer of said third material.

4. The method of claim 1, wherein said first material comprises a dielectric.

5. The method of claim 1, wherein said first material comprises an oxide.

6. A method for making a programmable resistance memory element, comprising the steps of:
    providing a layer of a conductive material;
    forming a layer of a first material over said layer of said conductive material;
    forming a layer of a second material over said layer of said first material, said second material being photoresist;
    removing a portion of said layer of said second material to form a photoresist mask over said layer of said first material;
    silylating said photoresist mask to form a top silylated portion and a sidewall silylated portion;
    forming a layer of a third material over said top silylated portion, over said sidewall silylated portion and over an exposed portion of said layer of said first material;
    removing a portion of said layer of said third material;
    removing said top and sidewall silylated portions;
    removing a portion of said layer of said first material to form an opening in said layer of said first material; and
    depositing a programmable resistance material into said opening, said programmable resistance material in communication with said layer of said conductive material.

7. The method of claim 6, wherein said third material is photoresist.

8. The method of claim 6, further comprising the step of:
    after removing said portion of said layer of said first material, removing said layer of said second material and said layer of said third material.

9. The method of claim 6, wherein said first material comprises a dielectric.

10. The method of claim 6, wherein said first material comprises an oxide.

11. The method of claim 6, wherein said providing said layer of said conductive material comprising the steps of:
    providing a first dielectric material;
    forming a sidewall surface in said first dielectric material;
    forming said layer of said conductive material over said sidewall surface;
    forming a second dielectric material over said layer of said first conductive material wherein an edge of said layer of said conductive material is exposed.

12. The method of claim 6, wherein said layer of said conductive material is a sidewall spacer or a sidewall liner.

13. The method of claim 6, wherein said programmable resistance material comprises a phase change material.

14. The method of claim 6, wherein said programmable resistance material comprises a chalcogen element.

* * * * *

UNITED STATES PATENT AND TRADEMARK OFFICE
CERTIFICATE OF CORRECTION

PATENT NO. : 6,733,956 B2
DATED : May 11, 2004
INVENTOR(S) : Jon Maimon and Andrew Pomerene

It is certified that error appears in the above-identified patent and that said Letters Patent is hereby corrected as shown below:

<u>Column 1,</u>
Line 3, add the following:

-- GOVERNMENT RIGHTS
This invention was made with the United States Government support under contract SC-0344-00-002 awarded by ARFL/VSSE. The United States Government has certain rights in this invention. --

Signed and Sealed this

Third Day of August, 2004

JON W. DUDAS
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 6,733,956 B2 | Page 1 of 1 |
| APPLICATION NO. | : 10/072324 | |
| DATED | : May 11, 2004 | |
| INVENTOR(S) | : Jon Maimon and Andrew Pomerene | |

It is certified that error appears in the above-identified patent and that said Letters Patent is hereby corrected as shown below:

In the Specification
Column 1, Line 3, "contract SC-0344-00-002 awarded by ARFL/VSSE" should be changed to --Prime Contract No. F29601-00-D-0244/DO 0002 awarded by the U.S. Air Force--

Signed and Sealed this
Eleventh Day of February, 2014

Michelle K. Lee
*Deputy Director of the United States Patent and Trademark Office*